United States Patent
Reasoner et al.

(10) Patent No.: US 6,924,777 B2
(45) Date of Patent: Aug. 2, 2005

(54) ENHANCED ANTENNA USING FLEXIBLE CIRCUITRY

(75) Inventors: Kelly J. Reasoner, Fort Collins, CO (US); Lyle D. Frey, Loveland, CO (US); Paul Clinton Coffin, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 29 days.

(21) Appl. No.: 10/391,125

(22) Filed: Mar. 17, 2003

(65) Prior Publication Data

US 2004/0183743 A1 Sep. 23, 2004

(51) Int. Cl.⁷ .............................. H01Q 7/00; H01Q 1/40
(52) U.S. Cl. ....................................... 343/866; 873/895
(58) Field of Search .......................... 343/895, 700 MS, 343/867, 866, 742, 765, 873; 340/572.7, 572.8; H01Q 7/00, 1/40

(56) References Cited

U.S. PATENT DOCUMENTS

| | | | | |
|---|---|---|---|---|
| 3,017,633 A | * | 1/1962 | Marston et al. | 343/853 |
| 4,369,557 A | * | 1/1983 | Vandebult | 29/25.42 |
| 4,658,264 A | * | 4/1987 | Baker | 343/895 |
| 5,923,300 A | | 7/1999 | Mejia | 340/788 |
| 6,069,564 A | * | 5/2000 | Hatano et al. | 340/572.7 |
| 6,147,655 A | | 11/2000 | Roesner | 343/741 |
| 6,184,841 B1 | | 2/2001 | Shober et al. | 343/853 |
| 6,268,796 B1 | | 7/2001 | Gnadinger et al. | 340/572.5 |
| 6,373,708 B1 | * | 4/2002 | Ando et al. | 361/737 |
| 6,424,263 B1 | | 7/2002 | Lee et al. | 340/572.7 |
| 6,435,408 B1 | | 8/2002 | Daigle et al. | 235/441 |
| 6,445,297 B1 | | 9/2002 | Nicholson | 340/572.7 |
| 6,663,003 B2 | * | 12/2003 | Johnson et al. | 235/385 |
| 2003/0193445 A1 | * | 10/2003 | Mejia et al. | 343/867 |

FOREIGN PATENT DOCUMENTS

| | | |
|---|---|---|
| DE | 100 37854 A | 2/2002 |
| EP | 0541323 A | 5/1993 |
| EP | 1291 818 A | 3/2003 |
| WO | WO 02/095675 | 11/2002 |

* cited by examiner

*Primary Examiner*—Trinh Vo Dinh

(57) ABSTRACT

An antenna is disclosed that comprises a flexible printed circuit material having first and second halves that are joined by a fold section. A coil trace is on the first half and a coil trace is on the second half. The antenna further comprises a first jumper between coil traces. The flexible printed circuit material is folded along the fold section so that the first and second halves are disposed back-to-back. An apparatus for reading information from a transponder is also disclosed that comprises a reader having an antenna capable of transmitting and receiving signals from a transponder, with the reader using an antenna according to the present invention. A media storage system is also disclosed that comprises a plurality of transponders, each of which is disposed on a respective one of a plurality of data cartridges and transmits a data signal related to its data cartridge. The media storage system further comprises a cartridge access device internal to a system housing for retrieving and transporting the data cartridges, and a reader attached to the cartridge access device, the reader capable of receiving transmitted signals from and transmitting signals to the transponders. The reader comprises an antenna according to the present invention that is capable of receiving and transmitting signals.

27 Claims, 6 Drawing Sheets

ENHANCED ANTENNA USING FLEXIBLE CIRCUITRY

BACKGROUND OF THE INVENTION

1. Field of the Invention

This invention relates to an antenna and more particularly to an enhanced antenna using flexible circuitry.

2. Description of the Related Art

Media storage systems are well known in the art and are commonly used to store data cartridges at known locations and to retrieve desired data cartridges so that data may be written to or read from the data cartridges. Such media storage systems are often referred to as an autochanger media storage system or, simply, an autochanger ("media storage system"). A typical media storage system may include one or more different types of cartridge receiving devices for holding the various data cartridges. Different cartridge receiving devices comprise an individual cartridge storage location or a slot for holding single data cartridges, or cartridge storage racks or "magazines" for holding several data cartridges. Another type of cartridge receiving device may comprise a cartridge read/write device for reading data from or writing data to the data cartridges contained in the media storage system.

The media storage system can also be provided with a cartridge handling system for transporting the data cartridges between the various cartridge receiving devices, such as between a cartridge storage rack and a read/write device. A typical cartridge handling system includes a cartridge engaging assembly known as a "picker" that engages various data cartridges contained in the cartridge receiving devices, and also includes a positioning device for moving the picker among the various data cartridges.

Media storage systems of the type described above are usually connected to a host computer system, which can access or store data on the data cartridges. For example, if the host computer system issues a request for data contained on a particular data cartridge, a control system associated with the media storage system actuates the positioning device to move the "picker" along the cartridge storage locations until the picker is positioned adjacent the desired data cartridge. The picker can then remove the data cartridge from the cartridge rack and carry it to the cartridge read/write device. Once positioned adjacent the cartridge read/write device, the picker can insert the selected data cartridge into the read/write device so that the host computer can read data from or write data to the data cartridge. After the read/write operation is complete, the picker can remove the data cartridge from the cartridge read/write device and return it to the appropriate cartridge rack.

Since most such media storage systems contain a large number of individual data cartridges, some means is usually provided to enable the media storage system to identify and communicate with the desired data cartridge. One method for identifying and communicating with the data cartridges is by radio frequency identification (RFID) technology. A reader communicates with an identification device on a data cartridge over a radio frequency communication link. Information on the data cartridge identification device can include information that uniquely identifies the data cartridge as well as data relating to the type or classification of the data contained in the cartridge.

A typical reader includes an antenna, which comprises numerous turns of a fine wire or traces to form a coil etched on a printed circuit board. The data cartridge identification device typically comprises a RFID transponder that can have its own power source or derive power from a magnetic or electric field from the reader. The transponder can communicate data by radio frequency that is relevant to its data cartridge.

The coils of a conventional RFID antenna are formed on a single side of a rigid printed circuit board (PCB) and the processing limitations of rigid PCBs cause the single sided coil to be narrow in the middle, which decreases antenna performance. If a storage/retention device is included in the middle of the coil, the number of possible turns of the coil is further reduced, which further decreases performance. Other RFID antennas are formed on double-sided rigid PCBs but the distance between the first and second coils, and materials and the processing involved, make fabricating these types of antenna prohibitively expensive.

RFID uses low power in its transmission and using a conventional antenna, the transmission range between the antenna and transponder is kept in the range of 0–3 mm. Reading from this range creates a danger of damage to the reader, picker, and date cartridge data transponder if the reader is to perform while sweeping past the cartridges. The reader can collide with one of the data cartridges when it moves.

SUMMARY OF THE INVENTION

According to one embodiment of the present invention, an antenna comprises a flexible printed circuit material having first and second halves that are joined by a fold section. A coil trace is on the first half and a coil trace is on the second half. The antenna further comprises a first jumper between coil traces. The flexible printed circuit material is folded along the fold section so that said first and second halves are disposed back-to-back.

According to another embodiment, an apparatus for reading information from a transponder comprises a reader having an antenna capable of transmitting and receiving signals from a transponder. The antenna comprises a flexible printed circuit material having first and second halves that are joined by a fold section. A coil trace is on the first half and a coil trace is on the second half. The antenna further comprises a first jumper between the coil traces. The flexible printed circuit material is folded along the fold section so that said first and second halves are disposed back-to-back.

A further embodiment comprises a media storage system comprising a plurality of transponders, each of which is disposed on a respective one of a plurality of data cartridges and transmits a data signal related to its data cartridge. The media storage system further comprises a cartridge access device internal to a system housing for retrieving and transporting the data cartridges, and a reader attached to the cartridge access device, the reader capable of receiving transmitted signals from and transmitting signals to the transponders. The reader comprises an antenna capable of receiving and transmitting signals. The antenna comprises a flexible printed circuit material having first and second halves that are joined by a fold section. A coil trace is on the first half and a coil trace is on the second half. The antenna further comprises a first jumper between the coil traces. The flexible printed circuit material is folded along the fold section so that said first and second halves are disposed back-to-back.

These and other further features and advantages of the invention will be apparent to those skilled in the art from the following detailed description, taken together with the accompanying drawings, in which:

DETAILED DESCRIPTION OF THE INVENTION

Figure 1:
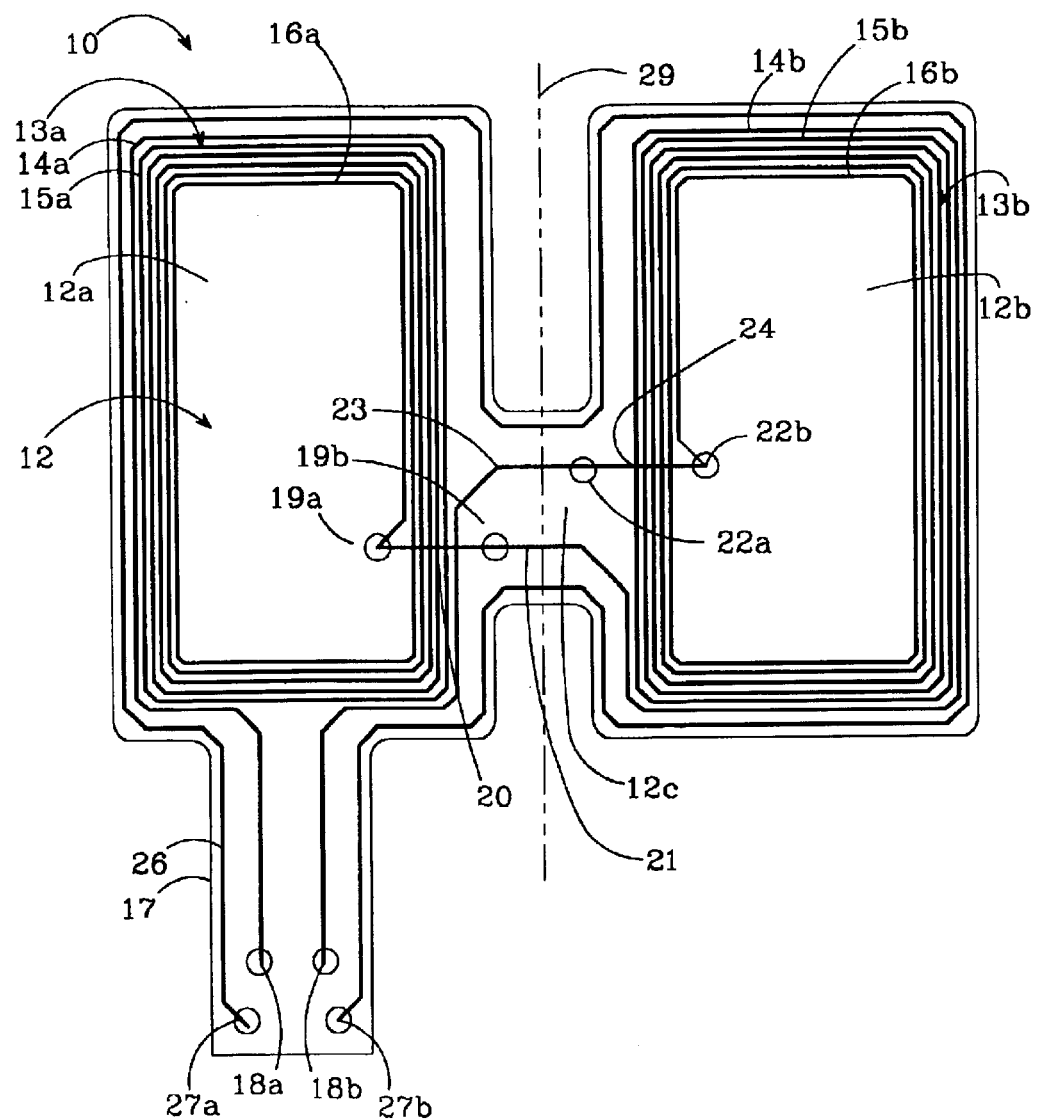
FIG. 1 shows a plan view of an embodiment of an antenna according to the present invention before the antenna is folded.
Figure 2:
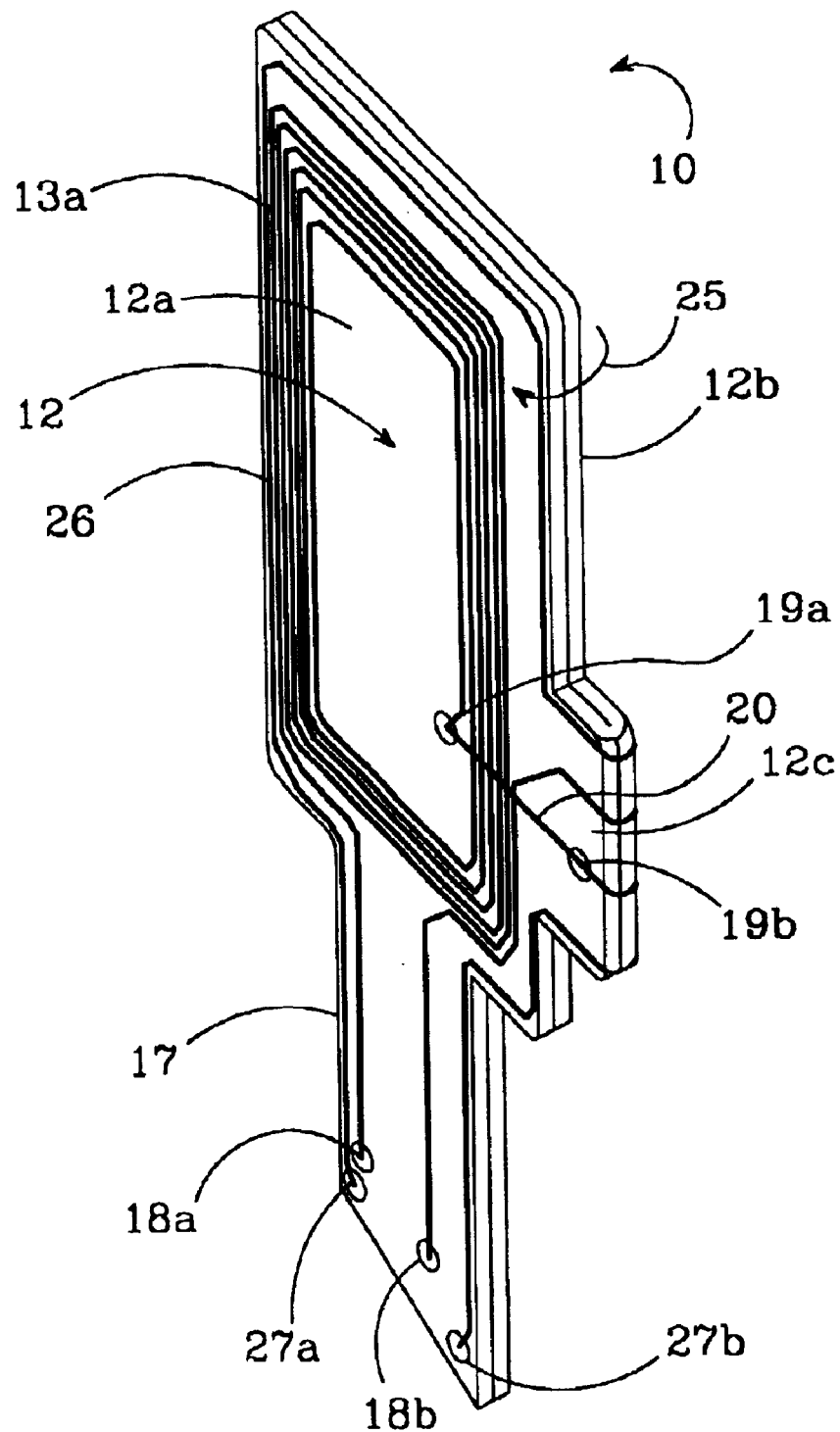
FIG. 2 shows a perspective view of the antenna in FIG. 1 after folding.

FIGS. 1 and 2 show an embodiment of an antenna 10 according to the present invention having a flexible printed circuit material 12, which has first and second antenna halves 12a, 12b that are joined by a fold section 12c. Antenna half 12a has a coil trace 13a and antenna half 12b has a similar coil trace 13b, with each of the coil traces 13a, 13b generating an electric and/or magnetic field when electricity is passed through it. Each half 12a, 12b can have many different dimensions with the dimensions as shown being 20 mm high and 10 mm wide. The flexible printed circuit material and traces can be made of many different materials with a preferred printed circuit material being mylar and a preferred trace being made of a conductive material such as copper. The traces can be formed on the mylar by known methods and can be many different widths, with a suitable width being approximately 15 thousands of an inch.

Each of the coil traces 13a, 13b include six coil turns, although the halves 12a, 12b can have more or less coil turns and either half can have more turns than the other. Coil trace 13a begins with an outermost coil turn 14a and as the trace continues around the perimeter of the half 12a, the second coil turn 15a is disposed on inside of the outermost turn 14a and has a smaller diameter than that of the outermost turn 14a. The trace 13a continues in this way until the innermost sixth turn of the coil 16a is on the inside of the previous five turns.

The first half 12a has a contact section 17 with a first solder pad pair 18a, 18b. The outermost turn 14a is electrically connected to solder pad 18a and the signal to be carried by the coil trace 13a is applied to solder pad 18a.

After the signal passes through the trace 13a, it should be "jumpered" to the coil trace 13b without shorting coil trace 13a. A second solder pad pair 19a, 19b is included on the first half 12a with pad 19a on the inside and pad 19b on the outside of the coil 13a. The end of the inside coil turn 16a is coupled to the solder pad 19a and a trace 21, which leads to the coil 13b, is connected to the solder pad 19b. A first jumper 20 is connected across the solder pads 19a, 19b and over the coil 13a so that the signal carried by the inside coil 16a is conducted to the trace 21. Before adding the jumper 20, the coil traces 13a, 13b are preferably covered by a protective layer of mylar with windows over the solder pads 19a, 19b for connecting the jumper to the solder pads. The mylar protects the coil trace 13a from being shorted by the jumper 20. The jumper 20 can be a zero ohm resistor or section of conductive material such as a wire.

The antenna's second half 12b has coil trace 13b that has six coil turns that are similar to the turns in the first coil trace 13a. The signal from solder pad 19b is conducted to the second coil trace 13b through the trace 21, which leads to the coil's outermost turn 14b. The second coil turn 15b is on the inside of turn 14b and the subsequent turns are successively on the inside of the previous turn. The sixth turn 16b is the innermost turn and the signal from this turn is jumpered over coil 13b across a third solder pad pair 22a, 22b. The sixth turn 16b is coupled to solder pad 22b and second trace 23 is coupled to pad 22a and leads back to solder pad 18b. A jumper 24 that is similar to jumper 20 is connected across the solder pads 22a, 22b to carry the signal from the sixth trace 16b to the trace 23. A protective mylar cover is included over the trace coil 13b except over the solder pads 22a, 22b.

The first and second coil traces 13a, 13b are disposed substantially around the perimeter of their respective halves 12a, 12b, although they can be disposed in many different ways and in many different locations. In antenna 10, the center portion of the halves 12a, 12b is free of traces. An advantage of arranging the traces around the perimeter is that the antenna 10 avoids the transmission limitations presented by having the traces near its center. Also, transponders that communicate with antenna 10 can have perimeter traces and communication is more efficient if the antenna has perimeter traces.

After the jumpers 20, 24 have been included on the halves, the trace side of the antenna can be covered by another layer of protective material (not shown), with a suitable protective material being a layer of plastic or mylar.

FIG. 2 shows the antenna 10 after it is folded. The antenna is folded along line 29 (shown in FIG. 1) in the fold direction 25. This results in a folded antenna with the mylar sides of the halves 12a, 12b facing each other and the traces, solder pads and jumpers directed out. This folding arrangement prevents damage to the traces or jumpers that could occur if the antenna were folded so that the traces and jumpers from the halves 12a, 12b faced each other. The antenna can be held in the folded position by double sided tape between the halves 12a, 12b, although other holding methods can be used such as mechanical clips or clamps.

The antenna traces 13a, 13b are arranged on their respective half so that when the antenna 10 is folded the direction of the coils is the same, e.g. clockwise. This allows the signal being transmitted to the coil traces 13a, 13b to combine to increase the field strength generated by the antenna 10. The traces between the halves are arranged to withstand the stress of folding without breaking or damage. Alternatively, the traces between the halves 12a, 12b can be designed to compensate for the folding stresses by including an additional length of trace matching any increase in trace length from folding.

A guard trace 26 (shown in FIGS. 1 and 2) passes around substantially all of the antenna traces 13a, 13b, with the guard trace 26 being the outermost trace around the perimeter of the halves 12a, 12b and the fold section 12c. It is connected at its ends to a fourth solder pad pair 27a, 27b. The trace 26 passes from the first half 12a to the second half across the fold section 12c. The guard trace 26 is included to determine when the antenna 10 is correctly connected and to verify that there are no tears in the antenna 10. If a tear were present, the trace 26 would be interrupted.

Figure 3:
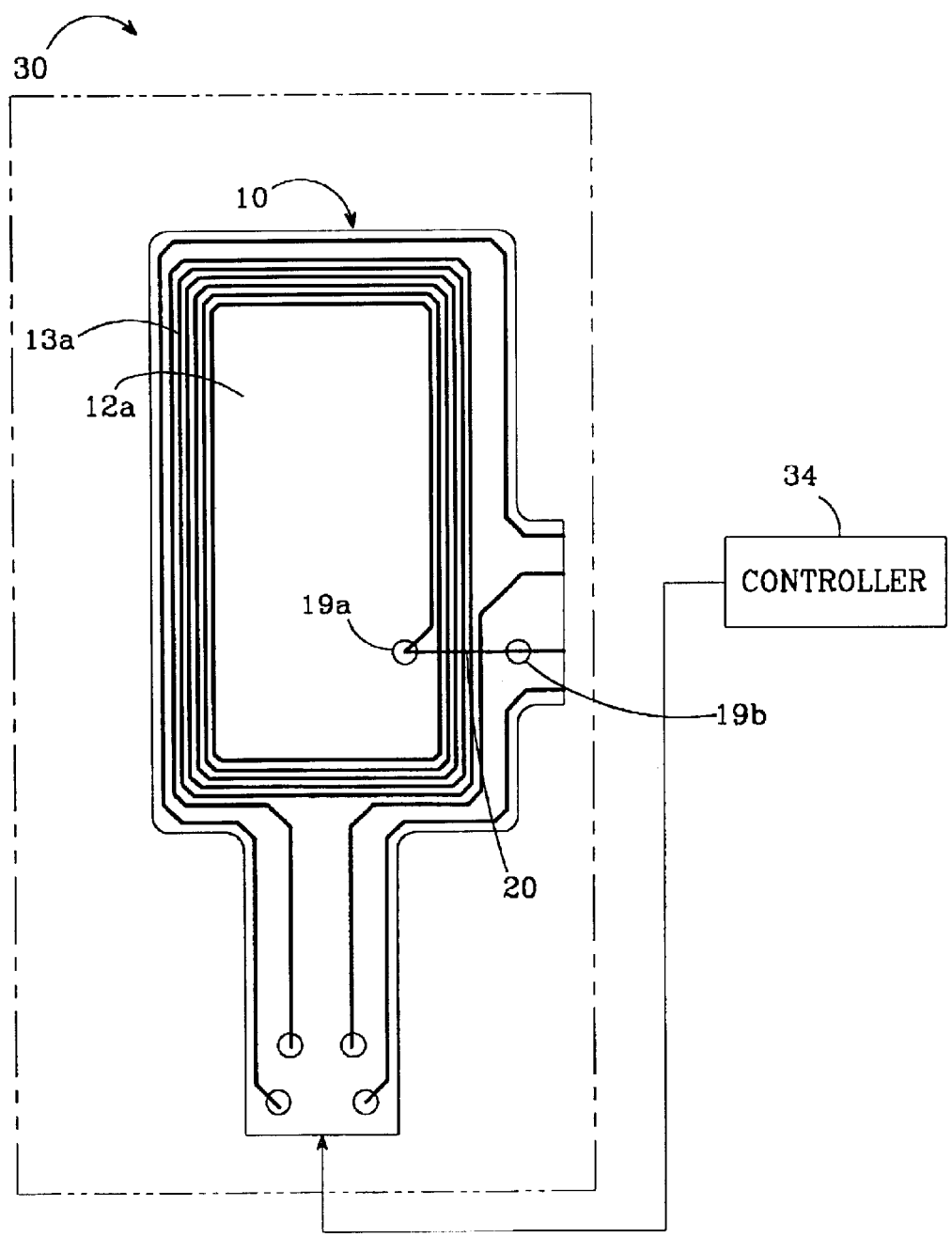
FIG. 3 shows an embodiment of a reader that utilizes an antenna according to the present invention coupled to a controller.

FIG. 3 shows a reader 30 that includes the antenna 10 and a controller 34 that is linked (via a direct or remote connection) with the reader 30 to control the reader communication. The antenna 10 is in its folded arrangement so only side 12a and its coil trace 13a, first solder pad pair 19a, 19b, jumper 20, etc., are visible. Where the reader 30 is an inductive reader, the controller 34 can cause an electrical current to pass through the antenna 10 to generate an energy field for activating a data cartridge transponder (as described below). Once the transponder is activated, the controller 34 can transmit an interrogation signal through the antenna 10 to query the transponder. When the reader 30 receives a response or a data signal from the transponder, the response or data signal is delivered to the controller 34 for further processing.

The reader 30 and controller 34 can be separate or fabricated together on a single circuit board (e.g., as an integrated circuit). The reader 30 and controller 34 can include any of a variety of circuitry and software or firmware known or later developed for performing the functions described herein.

Figure 4:
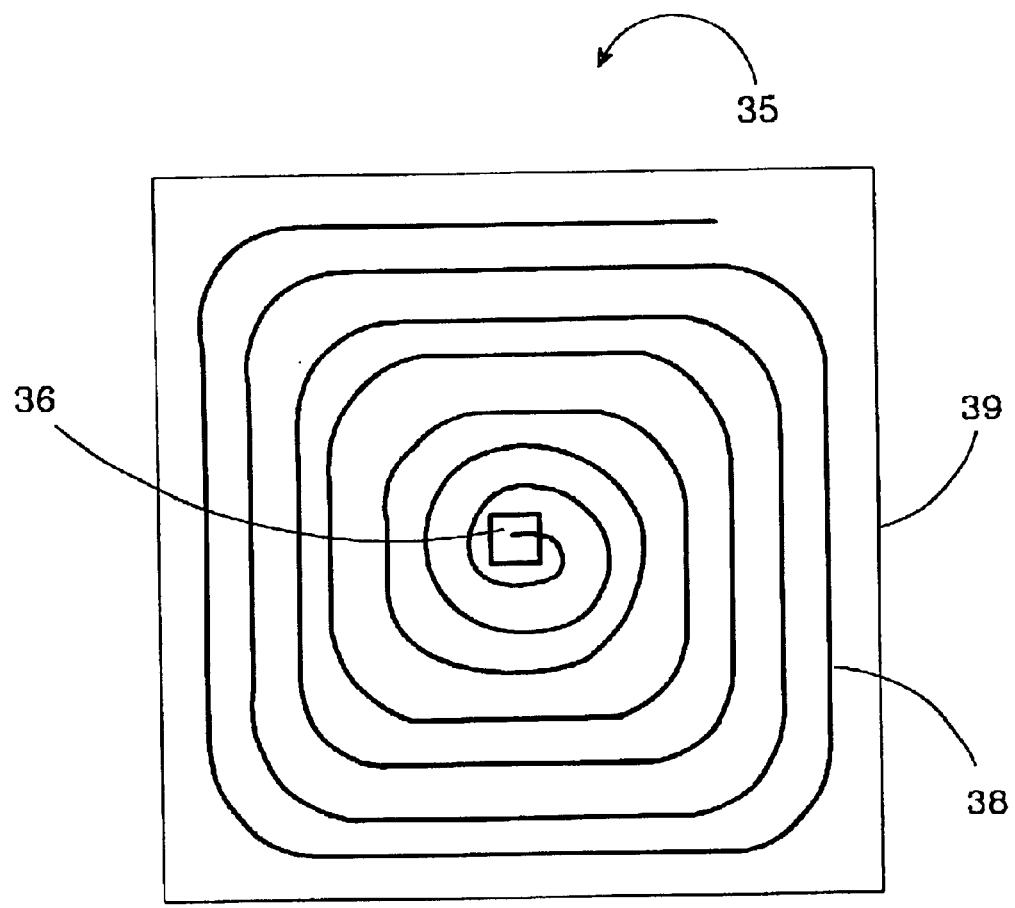
FIG. 4 is a transponder which can communicate with the reader of FIG. 3.

FIG. 4 shows a typical transponder 35 that can communicate with the antenna 10, with the transponder preferably disposed on a data cartridge. The transponder 35 preferably comprises a low powered integrated circuit (IC) 36 and a transponder antenna 38 etched on a printed circuit substrate 39. The IC 36 preferably includes a processor or processing logic, and memory. The processor receives the query signal from the reader 30 at the antenna 38. The processor retrieves data stored on the memory and generates a response or data signal containing the data requested by the query. The data signal is transmitted via the transponder antenna 38 and received at the reader antenna 32. While the transponder 35 is shown fabricated as a single printed circuit board, the transponder can comprise separate components linked to one another.

The transponder 35 can include suitable memory embodied in many different types of storage devices. The transponder 35 in one embodiment stores up to four kilobytes of data related to the data cartridge 20. However, the quantity of data stored on the transponder 35 can vary depending on the design characteristics of the transponder memory. The type of data that is stored on the transponder is not important to the scope of the present invention.

The reader 30 and the transponder 35 preferably communicate use radio frequency identification (RFID) technology, although other communication methods can also be used. Generally, RFID transponders communicate at radio frequency, have small power requirements (e.g., in the microwatt to milliwatt range), and can be passive, active, or a combination thereof. That is, a passive RFID transponder derives power from a magnetic or electric field generated by the reader, while an active RFID transponder is self-powered by an internal battery. A combination passive/active RFID transponder is powered by an internal battery, but only draws power from the battery after being passed through a high-energy activation field. RFID technology is well understood in the art. However, the reader 30 and the transponder 35 are not limited to RFID technology and can include other storage and communication systems now known or later developed for storing and reading data related to a data cartridge.

Figure 5:
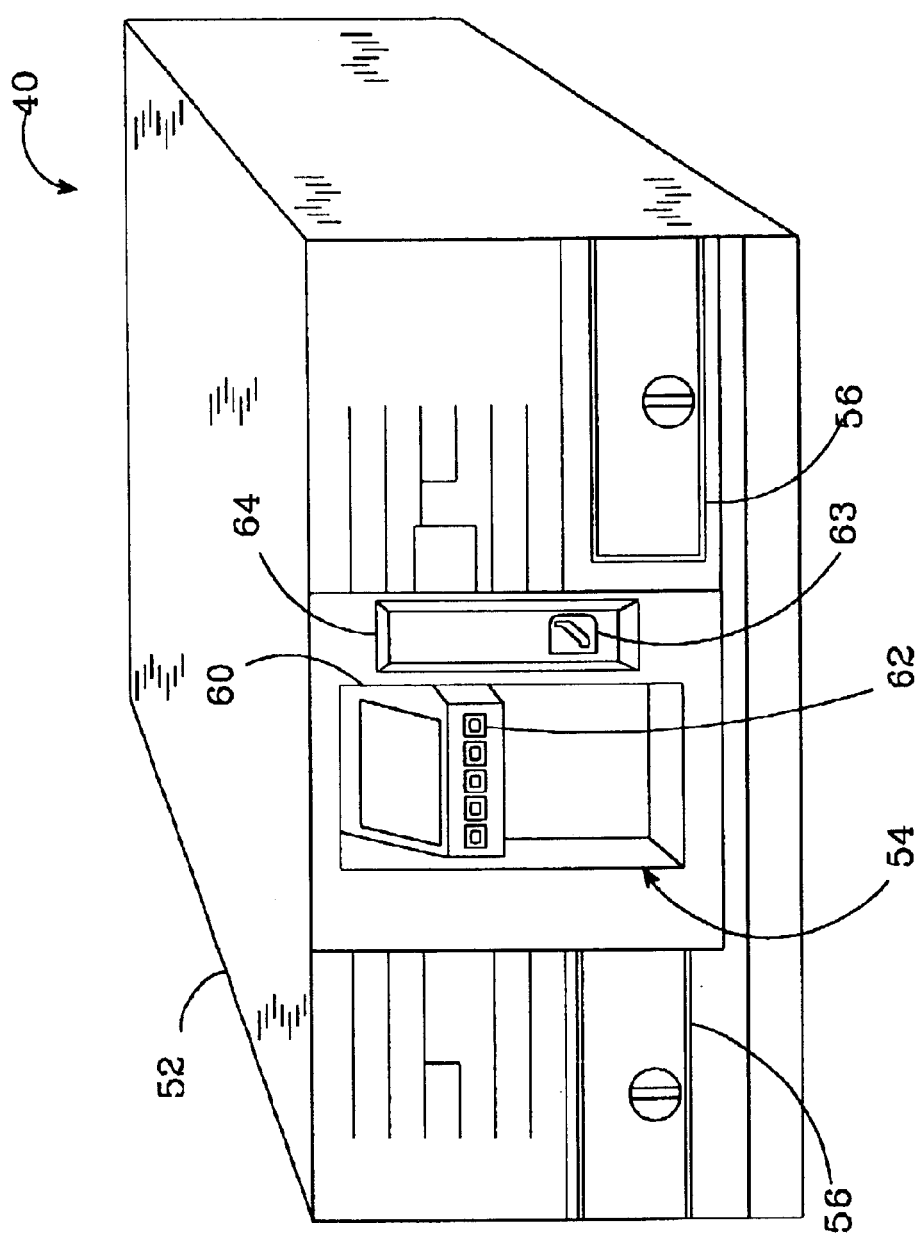
FIG. 5 is a perspective view of an embodiment of a media storage system that utilizes an antenna according to the present invention.

FIG. 5 shows an embodiment of a media storage system 40 that can use an antenna according to the present invention. The media storage system 40 includes internal data cartridges that can be arranged in cartridge storage racks or in a read/write device (or in a mail slot). A control system (not shown) associated with the media storage system moves an internal cartridge access device or "picker" along a positioning rail that is adjacent to storage racks and a read/write device. The picker accesses and delivers data cartridges in response to requests by a host computer. Once positioned, the control system signals the picker to withdraw the data cartridge from the storage rack and carry it to the read/write device. The linked computer can then read and/or write computer readable data to the cartridge.

The media storage system 40 further comprises a case or housing 52, and in a preferred embodiment, the housing 52 comprises an interface panel 54 and two drawers 56. The drawers 56 can slide open from the housing 52 and allow access to the system's internal storage racks. The interface panel 54 can include a display unit 60 and a keypad 62. The interface panel 54 can be provided for menu-driven information retrieval, diagnostics, etc.

In one embodiment, a reader 63 is mounted to the media storage system 40 in a recess 64 formed on the interface panel 54. The recess 64 is preferably sized to receive the leading edge of a data cartridge. The system operator can insert the data cartridge into the recess 64 so that the reader 63 is within the transmission range of the cartridge's identification device or transponder. The reader 63 can then activate the transponder and trigger a response. Accordingly, the data cartridge information contained on the transponder can be read and processed before or while the data cartridge is loaded into the media storage system 40. The reader 63 can utilize an antenna according to the present invention to increase the distance from which the reader 63 can read the information on the data cartridge.

When the picker accesses the internal data cartridges, the requested data cartridge can be readily identified from the data related to the data cartridge and read at the picker. Where the data cartridges are to be inventoried, the related data can be read from each data cartridge as the picker is moved about the media storage device 40. The invention contemplates both reading the related data from each data cartridge by stopping the picker adjacent to each data cartridge and/or as the picker is moving.

Figure 6:
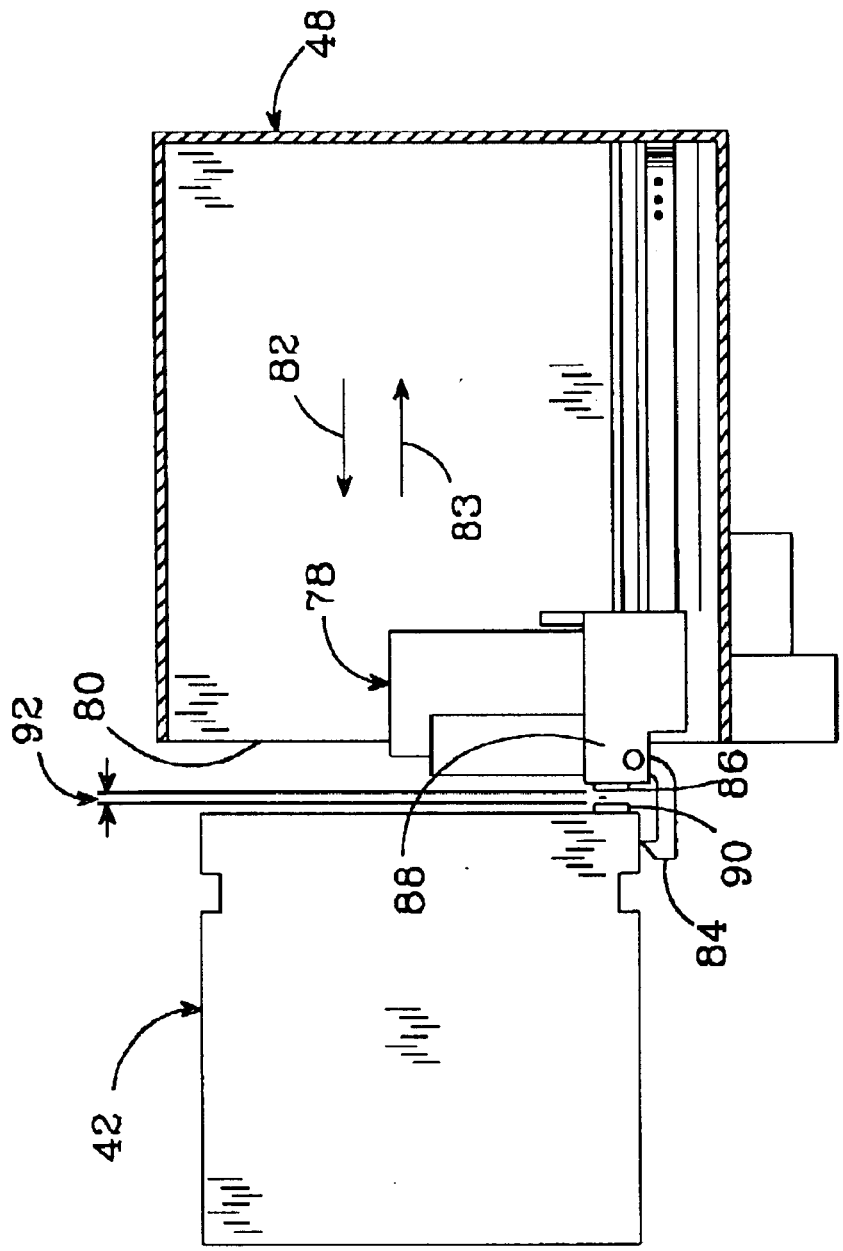
FIG. 6 is an elevation view of an embodiment of a cartridge access device that utilizes an antenna according to the invention.

A picker 48 is shown in FIG. 6 that comprises a cartridge plunge mechanism 78 mounted to the frame assembly so that it can be moved toward and away from the cartridge access end 80 of the frame assembly as indicated by arrows 82 and 83, respectively. A reader 86 can be mounted to the plunge mechanism 78 and can be moved near the data cartridge 42 by moving the plunge mechanism 78.

The plunge mechanism 78 also has a finger 84 to engage the data cartridge 42. The finger 84 allows the plunge mechanism 78 to engage and withdraw the data cartridge 42 from the storage rack 44 and the read/write device 46.

The reader 86 is preferably on the thumb portion 88 of the plunge mechanism 78. A transponder 90 containing data related to the cartridge 42 is mounted to each cartridge 42 in the media storage system 40. In use, the picker 48 is positioned adjacent the cartridge 42 so that the reader 86 is within the transmission range 92 of the transponder 90. Once the reader 86 is within the transmission range 92 of the transponder 90, the reader 86 activates the transponder 90 and triggers a response from the transponder 90.

Mounting the reader 86 to the plunge mechanism 78 provides the additional advantage of permitting the reader 86 to be adjusted at each data cartridge 42 to be within the required transmission range 92 of the transponder 90. For example, the plunge mechanism 78 can moved beyond the cartridge access end of the frame assembly thereby defining a transmission range 92 of one transponder 90. When the picker 48 is then moved adjacent another data cartridge 42 the plunge mechanism 78 can be extended beyond the cartridge access end 94 of the frame assembly 74 to define a different transmission range 92.

The transmission range 92 is generally defined by the distance at which the reader's antenna can transmit and receive to and from a transponder, although other factors may be relevant such as the likelihood of interference or crosstalk, etc. Embodiments of an antenna according to the present invention can transmit and receive at greater distances by having two coils, which results in an overall increase in the number of coil turns. The two coils are provided using a minimum number of jumpers to bridge the coils, and by using single trace technology, manufacturing costs are kept low.

The transmission range 92 for a reader 86 using some embodiments of an antenna according to the present invention is greater than the 3 mm range of conventional readers, with a range 92 for some embodiments being approximately 10 mm. However, the invention is not limited to a particular transmission range. One of the advantages of an increased distance between reader and transponder is the reduction in damage to the reader 86 and picker 48 that can occur when the picker 48 strikes a misaligned data cartridge.

Although the present invention has been described in considerable detail with reference to certain preferred configurations thereof, other versions are possible. It should be appreciated that the antenna can be used in many different radio frequency communication applications and apparatus communicating using RFID. The reader is not limited to any particular type or style of data cartridge. Various embodiments of the reader according to the invention, and related transponder, can be attached in many different locations using any suitable attachment means. Embodiments of the antenna can be utilized in any of a wide range of media storage systems now known in the art or that it may be developed in the future for accessing or taking inventory of one or more data cartridges.

We claim:

1. An antenna, comprising:
   a flexible printed circuit material having first and second halves that are joined by a fold section;
   a first coil trace on said first half having a plurality of first trace turns;
   a second coil trace on said second half having a plurality of second trace turns;
   a first jumper between said coil traces, said jumper passing from the inner most of said first trace turns to the outermost of said second trace turns, said flexible printed circuit material folded along said fold section so that said first and second halves are disposed back-to-back with said flexible printed circuit material between said first and second trace turns.

2. The antenna of claim 1, wherein said plurality of first and second trace turns each comprise trace turns with successively smaller diameters so that each turn after the first is disposed on the inside of the previous turn.

3. The antenna of claim 2, wherein said traces turns of each said coil trace turn in the same direction to successively smaller trace turns when said flexible printed circuit material is folded along said fold section.

4. The antenna of claim 1, wherein said coil traces are disposed substantially around the perimeter of said first and second halves, respectively.

5. The antenna of claim 1, further comprising a second jumper passing from the innermost of said second trace turns to outside said second coil trace.

6. The antenna of claim 1, which is capable of transmitting and receiving signals at radio frequency.

7. An antenna, comprising:
   a flexible printed circuit material having first and second halves that are joined by a fold section;
   a coil trace on said first half;
   a coil trace on said second half;
   a first jumper between said coil traces, said flexible printed circuit material folded along said fold section so that said first and second halves are disposed back-to-back; and
   a guard trace that is disposed around the perimeter of said first and second halves, around said coil traces, and not passing over said coil traces, said guard trace passing from said first half to said second half across said fold section.

8. An apparatus for reading information from a transponder, comprising:
   a reader having an antenna capable of transmitting and receiving signals from a transponder, said antenna comprising:
   a flexible printed circuit material having first and second halves that are joined by a fold section;
   a first coil trace on said first half;
   a second coil trace on said second half; and
   a first jumper between said coil traces, said jumper passing over at least a portion of said first or second coil traces, said flexible printed circuit material folded along said fold section so that said first and second halves are disposed back-to-back, with said printed circuit material between said first and second coil traces.

9. The apparatus of claim 8, further comprising a controller for controlling the reader communication, said controller capable of causing an electrical current to pass through said antenna to transmit a signal to a transponder, and said controller further capable of receiving signals delivered to said antenna from a transponder.

10. The apparatus of claim 9, wherein said controller capable of controlling the reader communication to cause said transponder to begin transmitting and thereafter cease transmitting.

11. The apparatus of claim 8, wherein said transponder is passive, and wherein said reader activates said passive transponder to transmit a data signal, said reader being responsive to said transmitted data signal.

12. The apparatus of claim 8, wherein said antenna is capable of transmitting and receiving signals at radio frequency.

13. The apparatus of claim 8, wherein said reader transmits and receives signals from a transponder using radio frequency identification technology (RFID).

14. The apparatus of claim 8, wherein each said coil trace comprises trace turns with successively smaller diameters, said trace turns of each said coil trace turn in the same direction to successively smaller trace turns when said flexible printed circuit material is folded along said fold section.

15. An apparatus for reading information from a transponder, comprising:
   a reader having an antenna capable of transmitting and receiving signals from a transponder, said antenna comprising:
   a flexible printed circuit material having first and second halves that are joined, by a fold section;
   a coil trace on said first half;

a coil trace on said second half; and a first jumper between said coil traces, said flexible printed circuit material folded along said fold section so that said first and second halves are disposed back-to-back; and a guard trace that is disposed substantially around the perimeter of said first and second halves, substantially around said first and second coil traces, and not passing over said first and second coil traces, said guard trace passing from said first half to said second half across said fold section.

16. A media storage system, comprising:

a plurality of transponders, each of which is disposed on a respective one of a plurality of data cartridges and transmits a data signal related to its data cartridge;

a cartridge access device internal to a system housing for retrieving and transporting said data cartridges;

a reader attached to said cartridge access device, said reader capable of receiving said transmitted signals from and transmitting signals to said plurality of transponders, said reader having a first antenna capable of receiving and transmitting signals, comprising;

a flexible printed circuit material having first and second halves that are joined by a fold section;

a first coil trace on said first half;

a second coil trace on said second half; and a first jumper between said coil traces, said jumper passing over at least a portion of said first or second coil traces, said flexible printed circuit material folded along said fold section so that said first and second halves are disposed back-to-back, with said printed circuit material between said first and second coil traces.

17. The system of claim 16, further comprising a controller for controlling said receiving and transmitting of signals by said reader.

18. The system of claim 17, wherein said controller is capable of causing an electrical current to pass through said antenna to transmit a signal to one of said plurality of transponders, and said controller is further capable of receiving signals delivered to said antenna from one of said plurality of transponders.

19. The system of claim 16, wherein said reader transmits and receives signals from said plurality of transponders at radio frequency, said reader and transponders communicate using radio frequency identification (RFTD) technology.

20. The system of claim 16, wherein at least one of said transponders is passive, and wherein said reader activates said at least one passive transponder to transmit said data signal, said reader being responsive to said transmitted data signal.

21. The system of claim 16, wherein each turn in said coil trace comprises trace turns with successively smaller diameters, said trace turns of each said coil trace turn in the same direction to successively smaller trace turns when said flexible printed circuit material is folded along said fold section.

22. A media storage system, comprising:

a plurality of transponders, each of which is disposed on a respective one of a plurality of data cartridges and transmits a data signal related to said respectively one of said data cartridges;

a reader mounted to a system housing and arranged to receive said transmitted signals from and to transmit signals to said plurality of transponders when one of said transponders is within a transmission range, said reader having an antenna capable of receiving and transmitting signals, said antenna comprising;

a first coil trace;

a second coil trace;

a first jumper between said coil traces; and a flexible printed circuit material having a fold section said first and second coil traces on said flexible printed circuit material, said jumper passing over at least a portion of said first or second coil traces, said flexible printed circuit material folded along said fold section so that said first and second coil traces are disposed back-to-back, with said printed circuit material between said first and second coil traces.

23. The system of claim 22, further comprising a controller for controlling said receiving and transmitting of signals by said reader.

24. The system of claim 22, wherein said reader transmits and receives signals from said one of said transponders within said transmission range at radio frequency, said reader and said one said transponders communicating using radio frequency identification (RFID) technology.

25. An antenna, comprising:

a flexible printed circuit material having first and second halves joined by a fold section;

a first means for receiving and transmitting signals disposed on said first half;

a second means for receiving and transmitting signals disposed on said second half; and a means for conducting signals between said receiving and transmitting means, said conducting means passing over at least a portion of said first and second receiving and transmitting means, said flexible printed circuit material folded along said fold section such that said first and second halves are disposed back-to-back, with said printed circuit material between said first and second means for receiving and transmitting signals.

26. The antenna of claim 25, wherein each said receiving and transmitting means comprises a coil trace.

27. The antenna of claim 25, wherein said conducting means comprises a jumper.

* * * * *

UNITED STATES PATENT AND TRADEMARK OFFICE
CERTIFICATE OF CORRECTION

PATENT NO. : 6,924,777 B2 Page 1 of 1
APPLICATION NO. : 10/391125
DATED : August 2, 2005
INVENTOR(S) : Kelly J. Reasoner et al.

It is certified that error appears in the above-identified patent and that said Letters Patent is hereby corrected as shown below:

In column 8, line 66, in Claim 15, delete "joined," and insert -- joined --, therefor.

In column 9, line 47, in Claim 19, delete "(RFTD)" and insert -- (RFID) --, therefor.

In column 9, line 53, in Claim 21, after "each" delete "turn in".

In column 10, line 7, in Claim 22, delete "respectively" and insert -- respective --, therefor.

In column 10, line 18, in Claim 22, delete "section" and insert -- section, --, therefor.

Signed and Sealed this

Fourth Day of August, 2009

JOHN DOLL
*Acting Director of the United States Patent and Trademark Office*